(12) United States Patent
Walter

(10) Patent No.: US 9,401,466 B2
(45) Date of Patent: Jul. 26, 2016

(54) METHOD FOR MANUFACTURE OF WIRE BONDABLE AND SOLDERABLE SURFACES ON NOBLE METAL ELECTRODES

(71) Applicant: Atotech Deutschland GmbH, Berlin (DE)
(72) Inventor: Andreas Walter, Dresden (DE)
(73) Assignee: Atotech Deutschland GmbH, Berlin (DE)
( * ) Notice: Subject to any disclaimer, the term of this patent is extended or adjusted under 35 U.S.C. 154(b) by 154 days.
(21) Appl. No.: 14/435,472
(22) PCT Filed: Nov. 14, 2013
(86) PCT No.: PCT/EP2013/073841
§ 371 (c)(1),
(2) Date: Apr. 14, 2015
(87) PCT Pub. No.: WO2014/086567
PCT Pub. Date: Jun. 12, 2014
(65) Prior Publication Data

US 2015/0287898 A1 Oct. 8, 2015

(30) Foreign Application Priority Data

Dec. 5, 2012 (EP) .................................. 12195672

(51) Int. Cl.
*C23C 18/16* (2006.01)
*H01L 33/40* (2010.01)
*H01L 33/62* (2010.01)
*H01L 33/00* (2010.01)

(52) U.S. Cl.
CPC .............. *H01L 33/62* (2013.01); *C23C 18/1651* (2013.01); *H01L 33/005* (2013.01); *H01L 33/40* (2013.01); *H01L 2224/03424* (2013.01); *H01L 2224/03464* (2013.01); *H01L 2224/05164* (2013.01); *H01L 2224/27464* (2013.01); *H01L 2224/27823* (2013.01); *H01L 2933/0016* (2013.01); *H01L 2933/0025* (2013.01); *H01L 2933/0066* (2013.01)

(58) Field of Classification Search
CPC ........... H01L 2224/05164; H01L 2224/05264; H01L 2224/05364; H01L 2224/05464; H01L 2224/05664; H01L 2224/05764; H01L 2224/05864; H01L 2224/13164; H01L 2224/13264; H01L 2224/13364; H01L 2224/13464; H01L 2224/13664; H01L 2224/13764; H01L 2224/13864; H01L 2224/13964; H01L 2224/29164; H01L 2224/29264; H01L 2224/29364; H01L 2224/29464; H01L 2224/29664; H01L 2224/29764; H01L 2224/29864; H01L 2224/29964; H01L 2224/37164; H01L 2224/37264; H01L 2224/37364; H01L 2224/37464; H01L 2224/37664; H01L 2224/37764; H01L 2224/37864; H01L 2224/37964; H01L 2224/45164; H01L 2224/45264; H01L 2224/45364; H01L 2224/45464; H01L 2224/45664; H01L 2224/45764; H01L 2224/45864; H01L 2224/45964; H01L 2224/48664; H01L 2224/48764; H01L 2224/48864; H01L 2224/0331–2224/0332; H01L 2224/0341–2224/03464; H01L 2224/2731–2224/2732; H01L 2224/27422–2224/27424; H01L 2224/03822–2224/03823; H01L 2224/11822–2224/11823; H01L 2224/27822–2224/27823; H01L 2224/03825; H01L 2224/1146–2224/11464; H01L 2224/11825; H01L 2224/2746–2224/27464; H01L 2224/085–2224/08503; H01L 2224/165–2224/16503; H01L 33/40; H01L 33/62; H01L 33/005; C23C 18/1633; C23C 18/1651
See application file for complete search history.

(56) References Cited

U.S. PATENT DOCUMENTS

| | | | | |
|---|---|---|---|---|
| 5,882,736 A * | 3/1999 | Stein | ....................... | C23C 18/42 106/1.5 |
| 6,211,572 B1 * | 4/2001 | Fjelstad | .............. | H01L 23/3114 257/759 |
| 6,361,823 B1 * | 3/2002 | Bokisa | ................ | C23C 18/1651 427/304 |
| 6,445,069 B1 * | 9/2002 | Ling | ...................... | H01L 21/288 257/738 |
| 6,616,967 B1 * | 9/2003 | Test | .................... | C23C 18/1651 257/E21.174 |
| 6,720,499 B2 * | 4/2004 | Bokisa | ................ | C23C 18/1651 174/256 |
| 7,380,698 B2 * | 6/2008 | Meyer | .................. | B23K 1/0012 228/194 |
| 8,148,257 B1 * | 4/2012 | Barth | ................ | H01L 21/76846 257/E21.575 |
| 8,801,914 B2 * | 8/2014 | Chen | ........................ | C25D 3/62 205/118 |
| 8,871,631 B2 * | 10/2014 | Lamprecht | .......... | H01L 21/4853 438/612 |
| 8,987,910 B2 * | 3/2015 | Ozkok | ............. | H01L 23/49866 257/762 |
| 8,997,341 B2 * | 4/2015 | Ejiri | ..................... | H05K 3/244 174/257 |
| 9,076,773 B2 * | 7/2015 | Uhlig | ..................... | H01L 24/03 |
| 2002/0047186 A1 * | 4/2002 | Tellkamp | .......... | H01L 23/49582 257/666 |
| 2005/0001324 A1 * | 1/2005 | Dunn | .................. | G01L 19/0069 257/762 |
| 2005/0104207 A1 * | 5/2005 | Dean | ........................ | H01L 24/05 257/734 |
| 2006/0001132 A1 * | 1/2006 | Abbott | .................... | C23C 30/00 257/666 |
| 2008/0138528 A1 * | 6/2008 | Gross | .................. | C23C 18/1651 427/436 |
| 2008/0251940 A1 * | 10/2008 | Lee | ..................... | H01L 23/3128 257/777 |
| 2009/0166858 A1 * | 7/2009 | Bchir | ................ | H01L 23/49811 257/737 |

(Continued)

OTHER PUBLICATIONS

PCT/EP2013/073841; PCT International Search Report and Written Opinion of the International Searching Authority dated Jul. 9, 2014.

(Continued)

*Primary Examiner* — Laura Menz
*Assistant Examiner* — Maliheh Malek
(74) *Attorney, Agent, or Firm* — Renner, Otto, Boisselle & Sklar, LLP

(57) ABSTRACT

The present invention relates to a method for manufacture of wire bondable and solderable surfaces on noble metal electrodes. The noble metal electrodes are activated by depositing a seed layer of palladium or a palladium alloy layer by electroless plating at 60 to 90° C. Next, an intermediate layer is deposited onto the seed layer followed by deposition of the wire bondable and/or solderable surface finish layer(s) onto the intermediate layer. This method is particularly suitable in the production of optoelectronic devices such as light emitting diodes (LEDs).

15 Claims, No Drawings

(56) References Cited

U.S. PATENT DOCUMENTS

| | | | | |
|---|---|---|---|---|
| 2010/0089613 A1* | 4/2010 | Takayanagi | ............ | C25D 3/562 174/126.2 |
| 2010/0258954 A1* | 10/2010 | Andoh | .............. | H01L 23/49811 257/784 |
| 2010/0314161 A1* | 12/2010 | Oh | .......................... | H01L 24/13 174/257 |
| 2011/0195567 A1* | 8/2011 | Nishizawa | .......... | C23C 18/1642 438/613 |
| 2012/0061710 A1* | 3/2012 | Toscano | ............... | B23K 1/0012 257/99 |
| 2012/0222892 A1* | 9/2012 | Sun | ........................ | C25D 5/022 174/257 |
| 2013/0000966 A1* | 1/2013 | Lee | ......................... | H01L 24/48 174/261 |
| 2013/0140563 A1* | 6/2013 | Kao | ......................... | H01L 22/32 257/48 |
| 2014/0251502 A1* | 9/2014 | Wei | .......................... | C23C 8/42 148/243 |

OTHER PUBLICATIONS

PCT/EP2013/073841; PCT International Preliminary Report on Patentability mailed Jun. 18, 2015.

* cited by examiner

METHOD FOR MANUFACTURE OF WIRE BONDABLE AND SOLDERABLE SURFACES ON NOBLE METAL ELECTRODES

The present application is a U.S. National Stage Application based on and claiming benefit and priority under 35 U.S.C. §371 of International Application No. PCT/EP2013/073841, filed 14 Nov. 2013, which in turn claims benefit of and priority to European Application No. 12195672.6 filed 5 Dec. 2012, the entirety of both of which is hereby incorporated herein by reference.

FIELD OF THE INVENTION

The present invention relates to the manufacture of optoelectronic devices such as light emitting diodes comprising noble metal electrodes and the formation of wire bondable and solderable surface finishes thereon.

BACKGROUND OF THE INVENTION

Optoelectronic devices such as light emitting diodes (LEDs) contain areas made of semiconducting substances which emit light when an electrical current is applied. Current LEDs are based on compound semiconductors, especially so called III-V compound semiconductors such as Ga—N, Ga—P and Ga—As or multilayer assemblies such as Ga—N/In—Ga—N which are deposited onto substrate materials such as sapphire wafers and silicon wafers.

Said compound semiconductors need to be electrically connected to an electrical power source by electrodes. Due to undesired diffusion processes between electrodes and the compound semiconductor layer(s), conventional electrode materials such as aluminium or copper can not be used in LEDs. Instead, electrodes made of noble metals such as platinum or gold are used as electrode materials.

The electrodes are connected to the power source by soldering or bonding a conductor such as a copper wire onto the electrodes. Hence, a solderable and/or wire bondable surface needs to be attached onto the noble metal electrodes in order to obtain a sufficient electrical contact and mechanical reliability between the conductor and the electrode. Furthermore, the joints formed between the electrodes and the conductor need to be reliable.

OBJECTIVE OF THE PRESENT INVENTION

It is the objective of the present invention to provide a method for forming a wire bondable surface and/or a solderable surface on noble metal electrodes made of e.g., platinum or gold in the manufacture of (opto)electronic devices.

SUMMARY OF THE INVENTION

This objective is solved by a method for manufacture of wire bondable and/or solderable surfaces on noble metal electrodes comprising, in this order, the steps of
  i. providing a substrate having at least one noble metal electrode attached thereon,
  ii. cleaning said at least one noble metal electrode,
  iii. depositing onto said at least one noble metal electrode a seed layer selected from palladium and palladium alloys by electroless plating from an aqueous plating bath wherein said plating bath has a temperature in the range of 60 to 90° C. during deposition of said seed layer,
  iv. depositing an intermediate layer selected from the group comprising nickel alloys and cobalt alloys onto said seed layer by electroless plating,
  v. depositing at least one surface finish layer onto the intermediate layer by electroless plating wherein said at least one surface finish layer is selected from the group consisting of palladium, palladium alloys, gold and gold alloys.

The method according to the present invention provides a surface finish for electrodes made of noble metals which provides a sufficient solderability and/or wire-bondability. Furthermore, the intermediate layer which is deposited between the electrodes and the surface finish layer(s) provides a high mechanical durability to the whole assembly. Thereby, the underlying compound semiconductor layer(s) and the substrate material of the LED are protected during soldering and/or wire bonding operations where a mechanical force is applied to the whole assembly.

DETAILED DESCRIPTION OF THE INVENTION

Compound semiconductor layer(s) in (opto)electronic devices such as LEDs need to be electrically contacted with a power source by an electrical conductor such as a wiring which is contacted to electrodes attached to said compound semiconductor layer(s). The electrical conductor is preferably contacted with the electrodes by soldering and/or wire bonding. The electrodes and the compound semiconductor layer(s) are attached to a substrate preferably selected from the group comprising sapphire wafers, silicon wafers and indium tin oxide wafers.

The electrodes attached to the compound semiconductor layer(s) need to be made of a noble metal because conventional electrode materials such as aluminium or copper tend to undesired diffusion processes when contacted with compound semiconductor materials usually used as the electroluminescent materials in LEDs and related devices.

Suitable electrodes comprise one or more noble metals preferably selected from the group comprising platinum, gold and palladium.

A surface finish deposited onto the noble metal electrodes is required for successive soldering and/or wire bonding by which methods the electrodes are electrically contacted with a power source.

Preferably, the surface finish is deposited by electroless plating and/or immersion-type plating only which methods in principle allow a selective deposition of metal and metal alloy layers onto sufficiently activated metal surfaces. Hence, in such a case the surface finish will not be deposited onto other areas of a substrate surface which are not sufficiently activated by e.g. a seed layer.

The deposition of conventional surface finishes known in the manufacture of printed circuit boards and the like, wherein the electrode material is copper and less common also aluminium is not applicable to electrodes made of noble metals preferably selected from the group comprising platinum, gold and palladium.

In case of aluminium as the electrode material, a zincate pre-treatment allows the electroless deposition of an intermediate layer selected from nickel alloys and cobalt alloys thereon.

In case of copper as the electrode material, an immersion plated noble metal layer such as an immersion plated palladium layer allows the electroless deposition of an intermediate layer selected from nickel alloys and cobalt alloys thereon.

Immersion plating of a noble metal layer such as an immersion plated palladium layer does not sufficiently activate the surface of a noble metal electrode such as a platinum or gold electrode (comparative examples 2 and 3).

Preferably, the electrode surface is cleaned in order to remove organic residues and the like prior to deposition of the surface finish layer(s). Preferably, etch cleaner compositions comprising an acid and optionally further comprising a surfactant and/or an oxidizing agent are employed to clean the surface of the noble metal electrodes. A particularly suitable etch cleaner composition comprises water, sulfuric acid and hydrogen peroxide.

Optionally, etch cleaning is followed by a rinse in an aqueous solution of an acid such as sulfuric acid.

In another embodiment of the present invention a plasma treatment is applied to clean the surface of the noble metal electrodes.

Combinations of etch cleaning and plasma treatment may be applied to clean the surface of the noble metal electrodes.

Optionally, a treatment for removal of undesired particles from the surface of the noble metal electrodes is applied in addition to an etch cleaning and/or a plasma treatment. A particularly suitable treatment of this kind is a standard clean 1 (SC1) treatment which comprises the step of treating the surface of the noble metal electrodes with an aqueous solution comprising aluminum hydroxide and hydrogen peroxide. Compositions and treatment conditions of this kind are known in the art.

The electrodes are contacted with the cleaner by e.g. dipping the substrate comprising the at least one electrode into the cleaner or spraying the cleaner onto the electrodes. In one embodiment of the present invention, the cleaning process is supported by application of ultrasonics.

Next, the cleaned surface of the electrodes is activated by contacting the electrodes with an electroless (autocatalytic) palladium plating bath comprising a source for palladium ions, a reducing agent and a complexing agent for palladium ions. A thin layer of palladium or a palladium alloy, depending on the kind of reducing agent employed, is deposited thereby onto the cleaned electrodes and serving as a seed layer for successive plating operations.

It was found by the inventor that the electroless plating bath for deposition of palladium or a palladium alloy onto the surface of said electrodes should be held at a temperature in the range of 60 to 90° C. in order to deposit palladium or a palladium alloy onto said electrodes. More preferably, the electroless plating bath is held during deposition of palladium or a palladium alloy onto said electrodes in a temperature range of between 60 to 80° C. Most preferably, the temperature is held during deposition in the temperature range of 60 to 70° C. Said palladium or palladium alloy layer is referred herein a seed layer.

A minimum plating bath temperature of 60° C. is required to obtain a sufficient activation of the electrode for successive deposition of the intermediate layer, i.e., by depositing a seed layer of palladium or a palladium alloy thereon (comparative example 4). The maximum temperature is mainly limited due to the boiling point of water (100° C. at atmospheric pressure) because the electroless plating baths for said deposition of the seed layer are preferably aqueous plating baths. For practical reasons in industrial application of the method according to the present invention, the maximum temperature of the electroless plating bath during deposition of the seed layer is preferably 90° C., more preferably 80° C. and most preferably 70° C. in order to limit the amount of water evaporated from the heated electroless plating bath during use.

The source of palladium ions in the electroless plating bath employed for deposition of the seed layer onto the cleaned surface of the noble metal electrode is preferably selected from water soluble palladium compounds such as palladium sulfate, palladium chloride and palladium acetate. Alternative sources for palladium ions are the reaction products of such palladium salts with one or more nitrogen-containing complexing agent such as cationic palladium-ethylenediamine complexes with e.g. sulfate or chloride counter ions.

The concentration of palladium ions in the electroless plating bath for depositing the seed layer onto the noble metal electrode preferably ranges 0.5 to 500 mmol/l, more preferably from 1 to 100 mmol/l.

The reducing agent for deposition of palladium is preferably selected from the group comprising formic acid, a derivative or salt thereof. Suitable derivatives of formic acid are for example esters of formic acid, such as formic acid methyl ester, formic acid ethyl ester and formic acid propyl ester. Other suitable derivatives of formic acid are for example substituted and non-substituted amides such as formamide and N,N-dimethylformamide. Suitable counter ions for salts of formic acid are for example selected from lithium, sodium, potassium and ammonium.

A pure palladium layer is deposited from such a plating bath.

The reducing agent for deposition of a palladium alloy is preferably selected from the group consisting of hypophosphite compounds such as sodium hypophosphite (deposition of Pd—P alloys) and borane compounds such as dialkylamine borane (deposition of Pd—B alloys).

Most preferably, the reducing agent for depositing a palladium alloy is sodium hypophosphite.

The concentration of the reducing agent in the electroless plating bath preferably ranges from 10 to 1000 mmol/l.

The at least one complexing agent for palladium ions in the electroless plating bath for depositing the seed layer onto the noble metal electrode is preferably a nitrogen-containing complexing agent. More preferably, the complexing agent for palladium ions is selected from the group consisting of primary amines, secondary amines and tertiary amines. Suitable amines are for example ethylene-diamine, 1,3-diamino-propane, 1,2-bis (3-amino-propyl-amino)-ethane, 2-diethyl-amino-ethyl-amine, diethylene-triamine, diethylene-tri-amine-penta-acetic acid, nitro-acetic acid, N-(2-hydroxyethyl)-ethylene-diamine, ethylene-diamine-N,N-diacetic acid, 2-(dimethyl-amino)-ethyl-amine, 1,2-diamino-propyl-amine, 1,3-diamino-propyl-amine, 3-(methyl-amino)-propyl-amine, 3-(dimethyl-amino)-propyl-amine, 3-(diethyl-amino)-propyl-amine, bis-(3-amino-propyl)-amine, 1,2-bis-(3-amino-propyl)-alkyl-amine, diethylene-triamine, triethylene-tetramine, tetra-ethylene-pentamine, penta-ethylene-hexamine and mixtures thereof.

The mole ratio of the at least one complexing agent and palladium ions in the electroless plating bath ranges from 2:1 to 50:1.

The pH value of the electroless palladium or palladium alloy plating bath preferably ranges from 4 to 7 because the plating bath tends to be unstable at a pH value below 4. More preferably, the pH value of the plating bath ranges from 5 to 6.

In one embodiment of the present invention, the electroless plating bath further comprises at least one additional stabilizer in an amount of preferably 0.001 to 0.1 mol/l, more preferably 0.001 to 0.01 mol/l.

Such additional stabilizers may extend the life time of the electroless palladium or palladium alloy plating bath used for depositing the seed layer onto the noble metal electrodes at an elevated plating bath temperature.

The additional stabilizers are preferably sulfimides. A preferred sulfimide is saccharin and derivatives thereof. The most preferred sulfimide is saccharin.

Other optional additives in the electroless palladium or palladium alloy plating bath are selected from the group comprising polyphenylsulfides, pyrimidines, polyalcohols and inorganic complexing agents like rhodanide. Preferred pyrimidines are nicotine amide, pyrimidine-3-suphonic acid, nicotinic acid, 2-hydroxy pyridine and nicotine. Preferred poly alcohols are polyethyleneglycol, polypropyleneglycol, polyethyleneglycol-polypropyleneglycol copolymers and derivatives thereof.

Next, an intermediate layer is deposited onto the seed layer by electroless plating. The intermediate layer is preferably selected from the group consisting of nickel alloys and cobalt alloys. Suitable nickel alloys are binary nickel alloys such as Ni—P alloys and Ni—B alloy, and ternary nickel alloys such as Ni—Mo—P alloys and Ni—W—P alloys. Suitable cobalt alloys are for example binary cobalt alloys such as Co—P alloys and Co—B alloys, and ternary cobalt alloys such as Co—Mo—P and Co—W—P alloys.

Suitable electroless plating baths for deposition of the intermediate layer onto the seed layer comprise a source for nickel or cobalt ions, an optional source of second metal ions, a reducing agent such as sodium hypophosphite in case a phosphorous containing alloy is to be deposited or a borane compound such as alkylamine boranes in case a boron containing alloy is to be deposited.

An electroless plating bath comprising a source of nickel ions and hypophosphite ions is suitable for deposition of Ni—P alloys. Likewise, a source of cobalt ions and hypophosphite ions lead to deposition of a Co—P alloy. In case a borane compound is used instead of hypophosphite ions as reducing agent, respective Ni—B or Co—B alloys are obtained. Adding a source of second metal ions to the plating bath allows deposition of respective ternary alloys.

Suitable electroless plating baths further comprise at least one complexing agent such as polycarboxylic acids and/or hydroxycarboxylic acids and optionally at least on stabilizing agent such as antimony ions, lead ions, bismuth ions, and/or organic compounds containing sulfur such as thiourea or a derivative thereof.

Suitable electroless plating bath compositions and plating parameters such as the plating bath temperature during deposition for depositing the intermediate layer onto the seed layer are known in the art.

The intermediate layer selected from nickel alloys and cobalt alloys is considerably harder than the electrode layer made of a noble metal and the surface finish layer(s) plated onto the intermediate layer. Hence, the intermediate layer provides mechanical stability to sensitive parts of a LED device such as the substrate material and the light emitting diode part itself during soldering and/or wire bonding operations. The wire is pressed with a considerable force during wire bonding onto the surface finish layer(s) on top of the intermediate layer which distributes/captures most part of this force due to the inherent hardness of the nickel alloy or cobalt alloy which serves as the intermediate layer.

The thickness of the intermediate layer preferably ranges from 0.1 to 5 µm, more preferably from 0.15 to 3 µm.

Next, the solderable and/or wire bondable layer (denoted herein "surface finish layer(s)") is deposited onto the intermediate layer.

The surface finish layer(s) may consist of a single layer deposited onto the intermediate layer or of two individual layers, depending on the technology used later on to connect the electrodes with the power source and/or stability/reliability demands of said connection.

A single surface finish layer is a gold layer deposited by immersion type plating onto the intermediate layer. Such gold layers as the surface finish can be used for soldering and bonding e.g. a gold wire onto the electrodes. The thickness of the gold layer preferably ranges from 0.01 to 0.5 µm, more preferably from 0.05 to 0.3 µm.

Another type of a suitable single surface finish layer is a palladium or palladium alloy layer deposited onto the intermediate layer by electroless plating. The same kind of plating bath compositions as used for activating the electrodes made of a noble metal can be applied for this task. Accordingly, palladium or palladium alloys such as Pd—P and Pd—B alloys are deposited from a plating bath comprising a source for palladium ions, a reducing agent and at least one complexing agent for palladium ions.

Most preferably, the plating bath is an aqueous plating bath for depositing palladium comprising a source for palladium ions such as palladium sulfate, a reducing agent selected from formic acid, salts and derivatives thereof and at least one nitrogen-containing complexing agent.

Palladium or a palladium alloy as a single surface finish layer is particularly suitable for bonding wires made of copper, palladium, or palladium coated copper wires onto the electrodes.

The thickness of palladium or a palladium alloy serving as a single surface finish layer preferably ranges from 0.02 to 1 more preferably from 0.2 to 0.5 µm.

A suitable multilayer surface finish which is in accordance with the present invention consists of a palladium or palladium alloy layer deposited by electroless plating onto the intermediate layer and a gold layer or gold alloy layer deposited either by immersion-type plating or electroless plating onto said palladium or palladium alloy layer.

The palladium or palladium alloy layer may be deposited from an electroless plating bath composition as described above.

The thickness of the palladium or palladium alloy layer deposited between the intermediate layer and the gold layer preferably ranges from 0.1 to 0.5 µm, more preferably from 0.15 to 0.3 µm.

The thickness of the gold layer deposited onto said palladium or palladium alloy layer preferably ranges from 0.01 to 0.5 more preferably from 0.05 to 0.3 µm.

For this purpose, immersion type or electroless gold plating electrolytes known from prior art can be used. Such plating bath compositions are also suitable to deposit gold directly onto the intermediate layer.

Suitable immersion-type plating baths for depositing gold onto the intermediate layer, or onto a palladium or palladium alloy layer comprise a source for gold ions and at least one complexing agent such as sulfite ions. Plating parameters such as the temperature of the plating bath during use and the plating time are known in the art and can be adapted to the desired plating rate and gold layer thickness to be achieved in routing experiments.

Preferably, the immersion-type plating bath for depositing gold is an aqueous composition.

Suitable electroless plating baths for depositing gold onto the intermediate layer, or onto a palladium or palladium alloy layer comprise a source for gold ions, a reducing agent and at least one complexing agent.

Most preferably, the plating bath for depositing gold is an aqueous immersion-type plating bath.

Examples

The invention will now be illustrated by reference to the following non-limiting examples.

Electrodes made of platinum with a diameter of 100 μm attached to silicon wafers as substrate material were used throughout all examples. The distance between individual electrodes was 400 μm.

The surface of the electrodes was cleaned with an aqueous solution comprising a surfactant and an acid.

Next, different methods for activating the electrode surface prior to deposition of a Ni—P alloy as the intermediate layer were tested.

The aqueous electroless palladium plating bath for deposition of the palladium layer onto the Ni—P alloy layer comprised palladium sulfate, sodium formate as reducing agent and ethylene diamine as complexing agent for palladium ions.

The aqueous immersion type plating bath for deposition of the gold layer onto the palladium layer comprised a source for gold ions and sulfite ions.

Comparative Example 1

The silicon wafer comprising platinum electrodes was dipped into an electroless nickel plating bath directly after cleaning and rinsing with water.

No plating of the Ni—P alloy (intermediate layer) was initiated on the cleaned electrode surface.

Comparative Example 2

The silicon wafer comprising platinum electrodes was activated after cleaning in an immersion-type palladium plating bath comprising palladium sulfate and sulfuric acid. The immersion type plating bath was held at 20° C. during use.

No plating of the Ni—P alloy (intermediate layer) was initiated on the cleaned electrode surface.

Comparative Example 3

The silicon wafer comprising platinum electrodes was activated after cleaning in an immersion-type palladium plating bath comprising palladium sulfate and sulfuric acid. The immersion type plating bath was held at 70° C. during use.

No plating of the Ni—P alloy (intermediate layer) was initiated on the cleaned electrode surface.

Comparative Example 4

The silicon wafer comprising platinum electrodes was activated after cleaning in an electroless palladium plating bath comprising palladium sulfate, sodium formate as reducing agent and a nitrogen-containing complexing agent. The plating bath was held at 55° C. during use.

No plating of the Ni—P alloy (intermediate layer) was initiated on the cleaned electrode surface.

Example 1

The silicon wafer comprising platinum electrodes was activated after cleaning in an electroless palladium plating bath comprising palladium sulphate, sodium formate as reducing agent and a nitrogen-containing complexing agent. The plating bath was held at 65° C. during use.

Plating of the Ni—P alloy (intermediate layer) was initiated on the cleaned electrode surface as desired.

Example 2

The silicon wafer comprising platinum electrodes was activated after cleaning in an electroless palladium plating bath comprising palladium sulfate, sodium formate as reducing agent and a nitrogen-containing complexing agent. The plating bath was held at 85° C. during use.

Plating of the Ni—P alloy (intermediate layer) was initiated on the cleaned electrode surface as desired.

The invention claimed is:

1. A method for manufacture of wire bondable and/or solderable surfaces on noble metal electrodes comprising, in this order, the steps of
   i. providing a substrate having at least one noble metal electrode attached thereon,
   ii. cleaning said at least one noble metal electrode,
   iii. depositing onto said at least one noble metal electrode a seed layer selected from palladium and palladium alloys by electroless plating from an aqueous plating bath wherein said plating bath has a temperature in the range of 60 to 90° C. during deposition of said seed layer and wherein said plating bath comprises a source for palladium ions, a reducing agent and a complexing agent for palladium ions,
   iv. depositing an intermediate layer selected from nickel alloys and cobalt alloys onto said seed layer by electroless plating,
   v. depositing at least one surface finish layer onto the intermediate layer by electroless plating wherein said at least one surface finish layer is selected from the group consisting of palladium, palladium alloys, gold and gold alloys, with the proviso that a single surface layer consisting of gold is deposited by immersion plating and the gold layer of a multilayer surface finish is deposited either by immersion plating or electroless plating onto a palladium or palladium alloy layer.

2. The method for manufacture of wire bondable and solderable surfaces on noble metal electrodes according to claim 1 wherein the at least one electrode comprises one or more of platinum, gold and palladium.

3. The method for manufacture of wire bondable and solderable surfaces on noble metal electrodes according to claim 1 wherein the aqueous plating bath as applied in step iii. further comprises a sulfimide compound.

4. The method for manufacture of wire bondable and solderable surfaces on noble metal electrodes according to claim 3 wherein the sulfimide compound is saccharin.

5. The method for manufacture of wire bondable and solderable surfaces on noble metal electrodes according to claim 3 wherein the concentration of the sulfimide compound ranges from 0.001 to 0.1 mol/l.

6. The method for manufacture of wire bondable and solderable surfaces on noble metal electrodes according to claim 1 wherein the plating bath has a temperature in the range of 60 to 80° C. during deposition of said seed layer.

7. The method for manufacture of wire bondable and solderable surfaces on noble metal electrodes according to claim 1 wherein the seed layer is made of palladium.

8. The method for manufacture of wire bondable and solderable surfaces on noble metal electrodes according to claim 1 wherein the reducing agent in the plating bath for deposition of the seed layer is selected from the group consisting of formic acid, a derivative thereof and a salt thereof.

9. The method for manufacture of wire bondable and solderable surfaces on noble metal electrodes according to claim 1 wherein the substrate comprising at least one electrode is selected from sapphire wafers, silicon wafers and indium tin oxide wafers.

10. The method for manufacture of wire bondable and solderable surfaces on noble metal electrodes according to claim 1 wherein the at least one surface finish layer is a palladium layer.

11. The method for manufacture of wire bondable and solderable surfaces on noble metal electrodes according to claim 1 wherein the at least one surface finish layer is a gold layer.

12. The method for manufacture of wire bondable and solderable surfaces on noble metal electrodes according to claim 1 wherein the surface finish consists of a palladium layer and a gold layer plated on top of the palladium layer.

13. The method for manufacture of wire bondable and solderable surfaces on noble metal electrodes according to claim 3 wherein the at least one surface finish layer is a palladium layer.

14. The method for manufacture of wire bondable and solderable surfaces on noble metal electrodes according to claim 3 wherein the at least one surface finish layer is a gold layer.

15. The method for manufacture of wire bondable and solderable surfaces on noble metal electrodes according to claim 3 wherein the surface finish consists of a palladium layer and a gold layer plated on top of the palladium layer.

* * * * *